US 6,593,580 B2

(12) United States Patent
Miyabayashi

(10) Patent No.: US 6,593,580 B2
(45) Date of Patent: Jul. 15, 2003

(54) ION SOURCE VAPORIZER

(75) Inventor: Kenji Miyabayashi, Kyoto (JP)

(73) Assignee: Nissin Electric Co., Ltd., Kyoto (JP)

(*) Notice: Subject to any disclaimer, the term of this patent is extended or adjusted under 35 U.S.C. 154(b) by 0 days.

(21) Appl. No.: 10/127,729

(22) Filed: Apr. 23, 2002

(65) Prior Publication Data
US 2002/0153493 A1 Oct. 24, 2002

(30) Foreign Application Priority Data
Apr. 24, 2001 (JP) ........................................ 2001-125566

(51) Int. Cl.⁷ ................................................ H01J 37/08
(52) U.S. Cl. .................................... 250/425; 250/423 R
(58) Field of Search ............................ 250/425, 423 R, 250/492.21

(56) References Cited

U.S. PATENT DOCUMENTS

| 3,789,253 A | * | 1/1974 | Kervizic et al. ............. 313/63 |
| 4,719,355 A | | 1/1988 | Meyers et al. |
| 4,845,366 A | | 7/1989 | Hoffman et al. |
| 4,855,604 A | | 8/1989 | Riahi |
| 5,604,350 A | | 2/1997 | Chu |

FOREIGN PATENT DOCUMENTS

| EP | 0 291 341 | 11/1988 |
| JP | U 3 112859 | 11/1991 |
| JP | 08 036983 | 2/1996 |
| JP | 08 212935 | 8/1996 |
| JP | 9007535 | 1/1997 |
| JP | 09/ 022661 | 1/1997 |
| JP | 09 055169 | 2/1997 |
| JP | 09 082230 | 3/1997 |

* cited by examiner

Primary Examiner—Kiet T. Nguyen
(74) Attorney, Agent, or Firm—Finnegan, Henderson, Farabow, Garrett & Dunner, LLP

(57) ABSTRACT

An ion source vaporizer comprises a hollow vaporizer main body, a heater, and a nozzle. The hollow vaporizer main body has an opening portion. The heater is installed outside the vaporizer main body and evaporates a solid sample within the vaporizer main body. The nozzle feeds a vapor produced within the vaporizer main body into an arc chamber. The ion source vaporizer further comprises a crucible for filling the solid sample which is provided within a cavity of the vaporizer main body, and a pressing unit for pressing a crucible bottom against a cavity bottom of the vaporizer main body. One end of the nozzle is screwed with an upper part of the crucible.

5 Claims, 3 Drawing Sheets

ION SOURCE VAPORIZER

BACKGROUND OF THE INVENTION

1. Field of the Invention

The present invention relates to an ion source vaporizer for heating a solid sample of an ion source supplied to an ion beam irradiation apparatus such as an ion implantation apparatus. More particularly, the present invention relates to an ion source vaporizer which can prevent a clogging of a nozzle for feeding a vapor sample from the vaporizer to an arc chamber.

2. Description of the Related Art

In these days, the surface modification with ion irradiation and the implantation of impurities into a silicon wafer or a glass substrate are actively conducted. These ions are obtained by ionizing a gas or a solid sample. The metal such as phosphorus, antimony or aluminum is solid at the ordinary temperature. To obtain ions from those solids, it is required that the solid sample is vaporized by heating and fed in vapor state into an arc chamber.

Usually, to produce a vapor from the solid sample, an ion source vaporizer is employed having a hollow sample cell and a heater for heating and evaporating the solid sample around it.

FIG. 2 shows one example of the conventional ion source vaporizer. An ion source vaporizer 1 includes an vaporizer main body 2, a nozzle 10, a nozzle fixing member 20 and a heater 30.

The vaporizer main body 2 is made of a metal such as stainless steel, and has a hollow structure with a bottom having an opening portion. The vaporizer main body 2 has a sample cell 3 on the bottom side of the hollow structure, a taper portion 4 in the central portion and a thread groove 5 in the upper portion. The sample cell 3 and an arc chamber 40 are connected through the nozzle 10 made of metal such as stainless steel. The nozzle 10 has a collar portion 11 is formed at one end portion thereof. The collar portion 11 is fixed to the taper portion 4 in a manner to cover the sample cell 3 by the nozzle fixing member 20. The nozzle fixing member 20 has a thread ridge 21 around a part of the outer periphery thereof and the thread ridge 21 is mated with the thread groove 5. The other end of the nozzle 10 is fitted into a gas inlet port, not shown, of the arc chamber 40. A solid sample 31 is ion species such as phosphorus or antimony. A temperature measuring device 32 such as a thermocouple is provided near the bottom of the sample cell 3. The heater 30 such as a sheath heater is provided around the vaporizer main body 2, and connected via a cable, not shown, to a power source. Furthermore, a depression portion 6 is provided in the bottom portion of the vaporizer main body 2. When the solid sample 31 is exchanged, it is required that the ion source vaporizer 1 is quickly cooled. To do this, the air is forced into the depression portion 6 from the compressed air supply, not shown.

The vaporizer main body 2 and the sample cell 3 are heated by energizing the heater 30, so that the solid sample 31 filled within the sample cell 3 is vaporized. A vapor produced in the sample cell 3 passes through a nozzle guide portion 12 of the nozzle 10 and fed into the arc chamber 40. A signal of the temperature measuring device 32 is sent to a controller, not shown, which controls a current applied to the heater on the basis of the signal to regulate the temperature of the sample cell 3.

In the ion source vaporizer 1 as described above, the taper portion 4 is formed as a result of machining requirement of the vaporizer main body 2. The collar portion 11 of the nozzle 10 is fixed to the taper portion 4 of the vaporizer main body 2, and the outer circumference of the collar portion 11 and the taper portion 4 are only in linear contact (more strictly in point contact at several points). Therefore, there is a great thermal resistance between the collar portion 11 and the taper portion 4, so that the heat of the vaporizer main body 2 is not sufficiently transmitted to the collar portion 11.

The arc chamber 40 has normally a higher temperature (e.g., 600° C.) than the sample cell 3, so that the heat is transmitted from the arc chamber 40 to the nozzle 10. However, the heat from the arc chamber 40 is mostly transmitted via the nozzle fixing member 20 in contact with the nozzle 10 to the vaporizer main body 2, not to the nozzle 10. Therefore, heat is difficult to be transmitted especially near the collar portion 11 of the nozzle 10 from the vaporizer main body 2, and further from the arc chamber 40. Hence, it is estimated in a certain ion source operation condition that the collar portion 11 has the lowest temperature in vapor transmission paths of the ion source vaporizer 1.

Consequently, a vapor of the solid sample 31 produced in the sample cell 3 is cooled on the way to the arc chamber 40 by the collar portion 11 having lower temperature, recrystallized and grown (a vapor coming later is further recrystallized), leading nozzle to a clogging problem.

Every time the nozzle 10 is clogged, the operation of an ion source must be stopped to replace the ion source vaporizer 1, resulting in a lower throughput of the ion implantation apparatus. Also, the ion source vaporizer 1 having the nozzle 10 clogged must be overhauled and cleaned, resulting in a problem in its overhaul.

When the ion species is antimony especially, this problem is worse. A melting point of antimony is about 630° C., and if the temperature of the sample cell 3 is increased above the melting point, antimony is completely melted within the sample cell 3 and becomes liquid. If the ion source is used in such a condition that the ion species is used in such a liquid state, liquid antimony sticks to the sample cell 3, the nozzle 10, and the arc chamber 40, causing a cleaning problem. Hence, when antimony is employed as the ion species, the temperature of the sample cell 3 must be set at the melting point or below.

FIG. 3 shows a conceptual graph representing the temperature distributions of the arc chamber 40, the nozzle 10 and the vaporizer main body 2 (sample cell 3). The line X indicates the temperature distribution of the nozzle 10. The temperature of the nozzle 10 is highest (A) at a portion fitted into the arc chamber 40, is decreased as being farther away from the arc chamber 40, and lowest (B) in the collar portion 11. This is because the collar portion 11 of the nozzle 10 is less subject to thermal conduction from other parts, as previously described. Herein, when the temperature of the sample cell 3 is set at a temperature (C) below the temperature (B), namely, on the line Y, if a sufficient amount of vapor can be collected, a vapor produced in the sample cell 3 does not come into contact with a lower temperature portion than the temperature (C) of the sample cell 3 till it reaches the arc chamber 40, and is not recrystallized. However, in a case where the solid sample 31 is antimony, a sufficient amount of vapor can not be collected if the temperature of the sample cell 3 is lower than the temperature (B). Hence, the temperature of the sample cell 3 must be set at a higher temperature (D) than (B). In this case, the vapor at the temperature (D), namely, on the line Z, comes into contact with the collar portion 11 of the nozzle 10 at lower temperature (B), so that the vapor temperature is decreased, and antimony is recrystallized in the collar portion 11. Therefore, the nozzle is clogged. A similar phenomenon is seen when the solid sample 31 is aluminum (melting point 660° C.).

SUMMARY OF THE INVENTION

Thus, it is an object of the present invention to provide an ion source vaporizer that can draw an ion beam stably for a long time, when antimony or aluminum is employed as the solid sample, in which antimony or aluminum vaporized once in the sample cell is not recrystallized in a nozzle to cause the clogging of the nozzle.

According to the present invention, there is provided an ion source vaporizer comprising: a hollow vaporizer main body having an opening portion; a heater for evaporating a solid sample within the vaporizer main body; a nozzle for feeding a vapor produced within the vaporizer main body into an arc chamber; a crucible for filling the solid sample, the crucible being disposed within a cavity of the vaporizer main body and being engaged with the nozzle; and a pressing unit for pressing the crucible against the vaporizer main body. In the ion source vaporizer, preferably, an upper part of the crucible is screwed one end portion of the nozzle, and a bottom part of the crucible is pressed against the bottom of the cavity of the vaporizer main body by the pressing unit.

With the above constitution, the crucible and the nozzle are engaged together, whereby the thermal resistance from the crucible to the nozzle can be reduced. Since the temperature of a part of the nozzle, especially, the collar portion of the nozzle where the temperature is likely to be lower can be almost equal to the vapor temperature, the recrystallization of vapor on the collar portion of the nozzle, namely, clogging of the nozzle can be prevented.

DETAILED DESCRIPTION OF THE INVENTION

Figure 1:
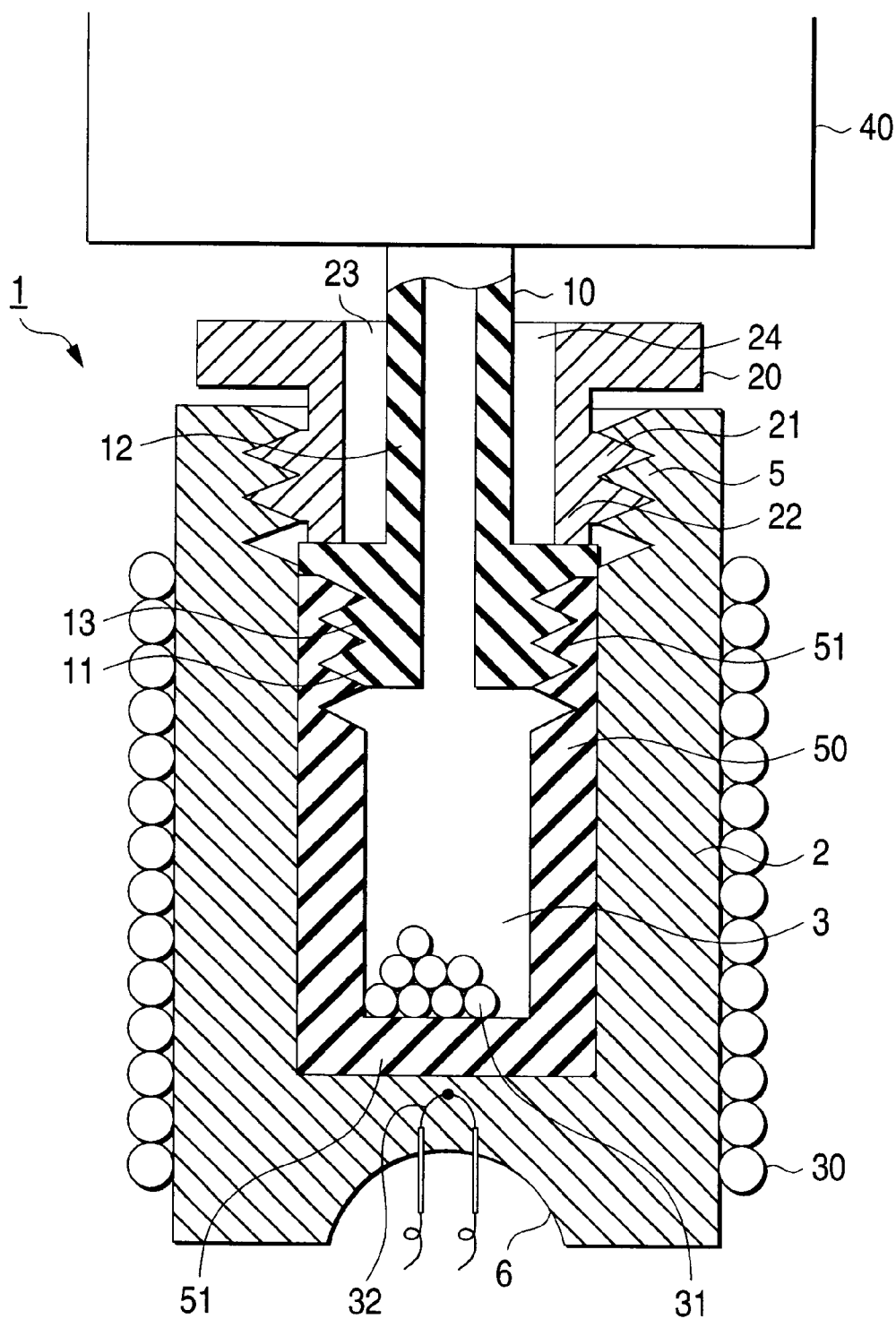
FIG. 1 is a conceptual view, partly in cross section, showing one example of an ion source vaporizer according to the present invention.

FIG. 1 is a conceptual view showing one example of an ion source vaporizer according to an embodiment of the present invention. The same or like parts are designated by the same numerals as in FIG. 2 of the conventional example. In the following, the different points from the conventional example will be mainly described.

An ion source vaporizer 1 has a crucible 50 detachably inserted into a cavity of a vaporizer main body 2. An inside of the crucible 50 is a sample cell 3, and is filled with a solid sample 31. A thread groove 51 is provided on an upper inner face of the crucible 50. A thread ridge 13 is provided on an outer face of a collar portion 11 at one end of a nozzle 10, and mated with the thread groove 51 of the crucible 50. The other end of the nozzle 10 is fitted into a gas inlet port, not shown, of an arc chamber 40 in the same manner as the conventional example.

The ion source vaporizer 1 further has a pressing unit for pressing a crucible bottom 52 that is the bottom of the crucible 2 against the bottom of the cavity of the vaporizer main portion 2. A nozzle fixing member 20 serving as the pressing unit is engaged with the thread groove 5 of the vaporizer main body 2 and presses the collar portion 11 of the nozzle 10 with a fixing member top end portion 22 that is the top end of the nozzle fixing member 20.

In this invention, the thread ridge 13 formed on the collar portion 11 of the nozzle 10 and the thread groove 51 of the crucible 50 are mated with each other, and pressed toward the crucible bottom 52 by the fixing member top end portion 22. Thereby, the nozzle 10 and the crucible 50 are placed in surface contact but not conventional point contact, resulting in a greater contact area to have a significantly smaller thermal resistance between them. Consequently, the heat of the crucible 50 can be transmitted smoothly to the collar portion 11 of the nozzle 10, so that the temperature of the collar portion 11 becomes higher. Hence, it is possible to prevent recrystallization on the collar portion 11, namely, the clogging of the nozzle 10 in the ion source vaporizer 1.

As described above, the detachable crucible 50 can be inserted into the cavity of the vaporizer main body 2. To insert the crucible 50 smoothly, there is a slight gap between the side face of the crucible 50 and the side face of the cavity of the vaporizer main body 2. If the crucible 50 is practically inserted into the cavity of the vaporizer main body 2, the side face of the crucible 50 makes direct contact with a part of the side face of the cavity of the vaporizer main body 2, but the contact area is only a small portion in the whole area. Therefore, the heat transfer between the crucible side face and the cavity side face of the vaporizer main body 2 is caused mainly by radiation but not conduction (hereinafter referred to as a "transfer from the side"). On the contrary, since the crucible bottom 51 and the cavity bottom of the vaporizer main body 2 are in direct contact, the heat transfer between the crucible bottom and the cavity bottom of the vaporizer main body 2 is caused mainly by conduction (hereinafter referred to as a "transfer from the bottom"). Since the conduction is more likely to pass the heat than the radiation, the thermal transfer from the vaporizer main body 2 to the crucible 50 is mainly caused by the transfer from the bottom.

Accordingly, to efficiently transfer the heat from the vaporizer main body 2 to the crucible 50, it is required to have a pressing unit for pressing the crucible bottom 52 against the cavity bottom of the vaporizer main body 2.

In the pressing unit, the thread ridge 21 formed partly around the outer circumference of the nozzle fixing member 20 is engaged with the thread groove 5 formed on the vaporizer main body 2, and the fixing member top end 22 forces the nozzle 10 down to consequently press the crucible bottom 51 against the bottom of the cavity of the vaporizer main body 2. As a result, the thermal resistance from the vaporizer main body 2 to the crucible 50 is decreased, thereby making the thermal transfer smooth. The following advantages are provided. (1) The temperature of the ion source vaporizer 1 can be increased rapidly. Consequently, after the new solid sample 31 is filled, the temperature of the ion source-vaporizer 1 can be increased rapidly, whereby the throughput of the ion implantation apparatus is increased. (2) The temperature of the ion source vaporizer 1 can be decreased rapidly. Consequently, when the solid sample 31 is exchanged, the temperature of the ion source vaporizer 1 can be decreased rapidly, whereby the throughput of the ion implantation apparatus is increased. (3) The temperature controllability of the crucible 50 can be improved. Since it is difficult to measure directly the temperature of the crucible 50, a temperature measuring device 32 is provided in practice on the bottom portion of the vaporizer main body 2 to measure the temperature. Consequently, a difference in temperature between the temperature measuring device 32 and the crucible 50 can be reduced. Moreover, owing to a predetermined pressure applied on the crucible 51, the difference in temperature between the temperature measuring device 32 and the crucible 50 can be always kept within a certain range.

Conventionally, since the solid sample 31 was directly filled in the cavity of the vaporizer main body 2, the cavity had to be cleaned every time of changing the kind of the solid sample 31 to be filled, for which the ion source vaporizer 1 could not be employed. In this invention, however, the solid sample 6 is filled in the crucible 50 that is detachably inserted into the ion source vaporizer 1. Therefore, a new crucible is prepared and the crucible 50 is only replaced with it, in changing the kind of the solid sample 31 to be filled, whereby the ion source vaporizer 1 can be immediately employed.

Further, if the material of the nozzle 10 and the crucible 50 is graphite, the following effect can be obtained.

In the use of the ion source vaporizer 1, the crucible 50 is filled with the solid sample at room temperature, and engaged with the nozzle 10. Then, the crucible 50 engaged with the nozzle 10 is loaded into the vaporizer main body 2. The vaporizer main body 2 is heated to several hundreds degrees centigrade to vaporize the solid sample 31. Thereafter, the vaporizer main body 2 is cooled below room temperature, the crucible 5 and the nozzle 10 are unengaged, and a new solid sample is filled within the crucible 5. However, if the nozzle 10 and the crucible 50 are made of an ordinary metal such as stainless steel, they may be heat-damaged at an engagement portion, so that they can not be reused. On the other hand, if they are made of graphite, no damage occurs, so that they can be reused many times. In addition, other materials (e.g., ceramics, heat resistant metals) maybe substituted for graphite, so far as they are chemically stable at the service temperature of the nozzle 10 and the crucible 50, with good thermal conductivity, and can be made easily, without heat-damage.

Also, a fixing member inner face 24 that is an inner surface of the nozzle fixing member 20 and a vapor guide portion 12 of the nozzle 10 may be kept out of contact, in other words, a gap 23 may be provided between the fixing member inner face 24 and the vapor guide portion 12.

The heat from the arc chamber 40 is likely to be transferred to the collar portion 11 of the nozzle 10, rather than via the nozzle fixing member 20 to the vaporizer main body 2. Consequently, the temperature of the collar portion 11 is higher than conventionally, whereby the recrystallization on the collar portion 11, or the clogging of the nozzle 20 in the ion source vaporizer 1 can be prevented.

In this example, the nozzle fixing member 20 is employed as the pressing unit, but instead, a spring may be provided between the arc chamber 40 and the over main body 2 to press the nozzle bottom 11 against the cavity bottom of the vaporizer main body 2 by the use of a spring force.

In practice, the ion source vaporizer 1 is attached on the arc chamber 40 in such a condition that the ion source vaporizer 1 is in horizontal position. Accordingly, when the ion source vaporizer 1 having the solid sample 31 filled in a standing state is attached to the arc chamber 40, the solid sample 31 may be spilt out of the nozzle 10 because the ion source vaporizer 1 is turned sideways. To prevent this solid sample 31 from being spilt, the collar portion 11 may comprise a labyrinth structure.

In this example, a sheath heater is employed as the heater 30. However, besides this sheath heater, this invention may employ a lamp heater or a laser-type heater.

EXAMPLES

In a Bernas type ion source (arc chamber 40), a powder antimony having a grain diameter of about 100 to 300 μm was used as the solid sample 31 to produce an amount of vapor. Using the ion source vaporizer 1 of this invention as shown in FIG. 1, the vaporizer temperature (temperature measuring device 32) was set at 520° C., and an antimony beam was drawn at abeam current of 500 μA. In the ion source vaporizer 1, the engagement portion between the nozzle 10 and the crucible 50 has a thread length of 4 mm and two and half ridges, and the gap 23 between the fixing member inner face 24 and the vapor guide portion 12 is 2 mm. The continuous operation was performed for 48 hours, for which there was no phenomenon that the beam current was decreased. The ion source vaporizer 1 was overhauled and inspected after 48 hours, in which no recrystallization of antimony was seen anywhere in the nozzle 10.

Figure 2:
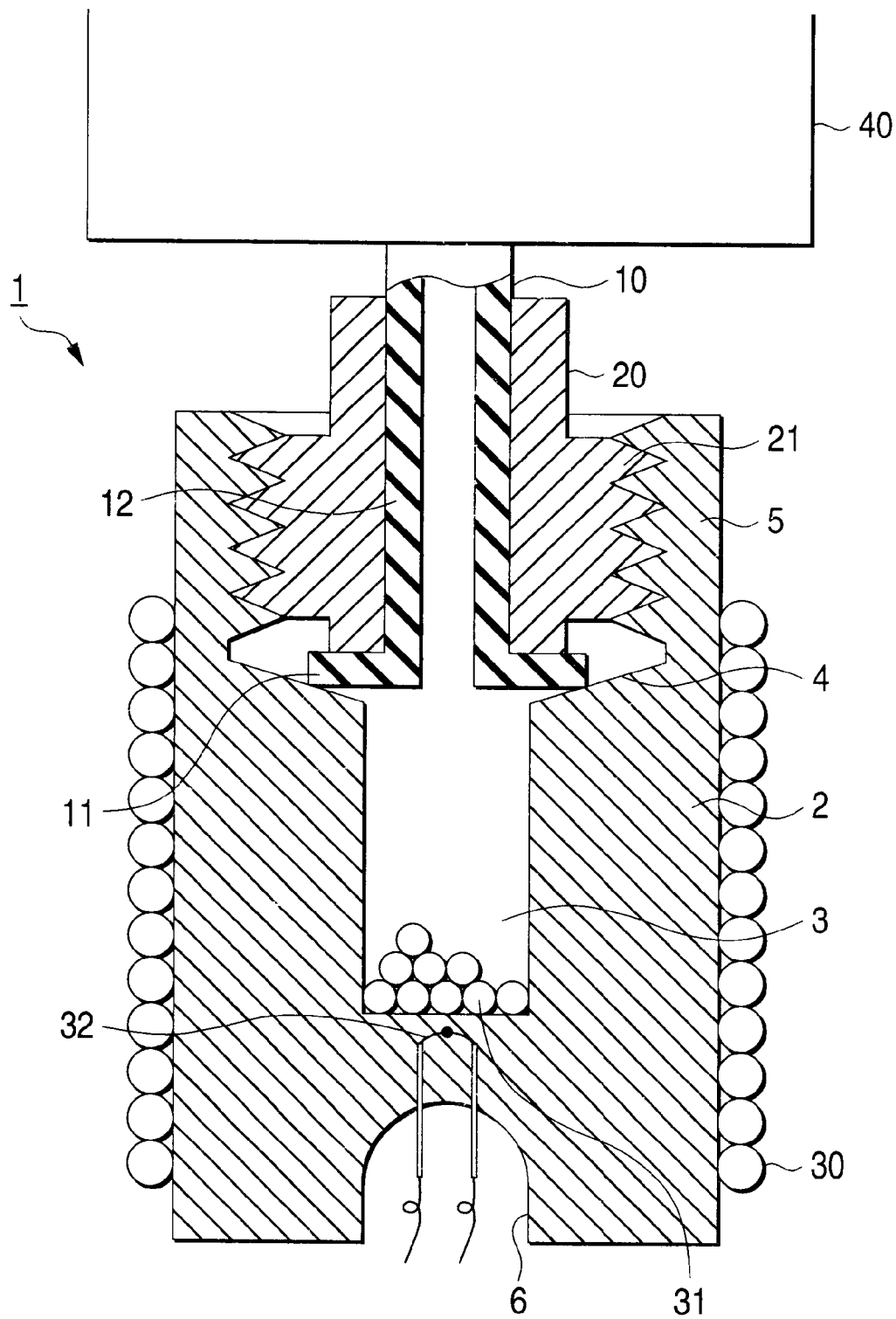
FIG. 2 is a conceptual view, partly in cross section, showing one example of the conventional ion source vaporizer.
Figure 3:
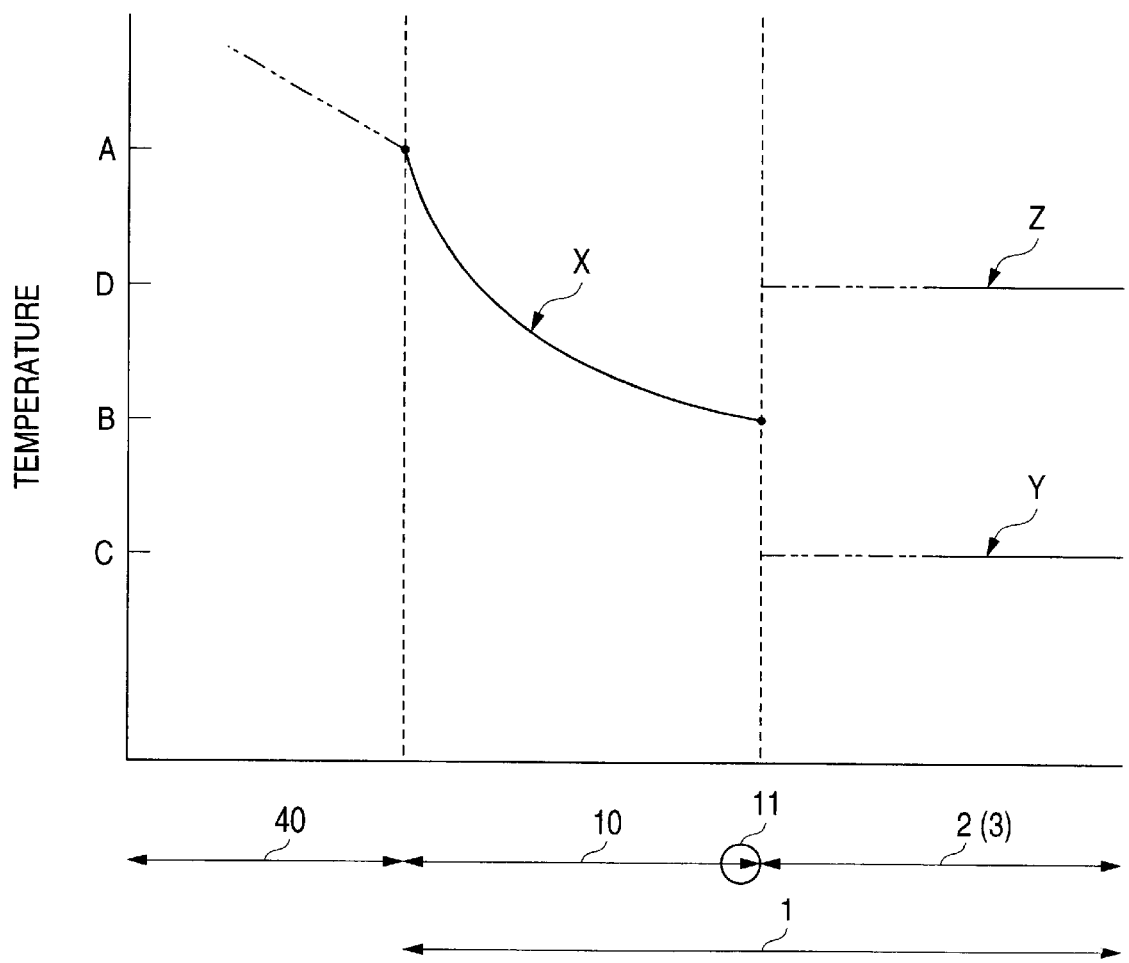
FIG. 3 is a conceptual graph representing the temperature changes of the arc chamber, the nozzle and the vaporizer main body (sample cell).

On the other hand, using the conventional ion source vaporizer 1 as shown in FIG. 2, an antimony beam was drawn under the same conditions. The beam current was drastically decreased in thirty minutes. In the meanwhile, the beam current could not be measured. Overhauling and inspecting the ion source vaporizer 1, it was found that recrystallized antimony sticking near the collar portion 11 of the nozzle 10 fully closed the vapor guide portion 12.

This invention as described above has the following effects.

With this invention, the crucible for filling the solid sample is provided within the cavity of the vaporizer main body, the nozzle and the crucible being engaged with each other, whereby the thermal resistance from the crucible to the nozzle can be reduced, so that the nozzle and the crucible can be made at the almost same temperature. Accordingly, apart of the nozzle, especially, the collar portion of the nozzle where the temperature is likely to be lower can be made at the temperature almost equal to the vapor temperature, whereby the recrystallization of vapor or the clogging of the nozzle can be prevented.

In addition, the unit pressing the crucible bottom against the cavity bottom of the vaporizer main body is provided, whereby the thermal resistance of the bottom portion of the crucible and the bottom portion of the cavity of the vaporizer main body can be reduced. Accordingly, the vaporizer can be subjected to quick heating or quick cooling, and the temperature controllability of the crucible can be improved.

What is claimed is:

1. An ion source vaporizer comprising:
    a hollow vaporizer main body having an opening portion;
    a heater for evaporating a solid sample within said vaporizer main body;
    a nozzle for feeding a vapor produced within said vaporizer main body into an arc chamber;
    a crucible for filling said solid sample, the crucible being disposed within a cavity of said vaporizer main body and being engaged with said nozzle; and
    a pressing unit for pressing said crucible against said vaporizer main body.

2. The ion source vaporizer according to claim 1, wherein an upper part of said crucible is screwed one end portion of said nozzle, and a bottom part of said crucible is pressed against a bottom of the cavity of said vaporizer main body by said pressing unit.

3. The ion source vaporizer according to claim 1, wherein said pressing unit has a cylindrical member having an inner face and an outer face, the inner face of said pressing unit is not in contact with an outer face of said nozzle, and the outer face of said pressing unit is partly engaged with an upper inner face of said vaporizer main body.

4. The ion source vaporizer according to claim 1, wherein said crucible is made from graphite.

5. The ion source vaporizer according to claim 1, wherein said nozzle is made from graphite.

* * * * *

UNITED STATES PATENT AND TRADEMARK OFFICE
CERTIFICATE OF CORRECTION

PATENT NO. : 6,593,580 B2
DATED : July 15, 2003
INVENTOR(S) : Kenji Miyabayashi

It is certified that error appears in the above-identified patent and that said Letters Patent is hereby corrected as shown below:

Column 6,
Line 64, "screwed one" should read -- screwed with one --.

Signed and Sealed this

Fourth Day of November, 2003

JAMES E. ROGAN
*Director of the United States Patent and Trademark Office*